United States Patent [19]

Shinjo

[11] Patent Number: 5,304,963
[45] Date of Patent: Apr. 19, 1994

[54] FILTER CIRCUIT FOR AN ELECTROMAGNETIC PICKUP

[75] Inventor: Izuru Shinjo, Himeji, Japan

[73] Assignee: Mitsubishi Denki Kabushiki Kaisha, Tokyo, Japan

[21] Appl. No.: 950,993

[22] Filed: Sep. 25, 1992

[30] Foreign Application Priority Data

Oct. 4, 1991 [JP] Japan .................................. 3-257610

[51] Int. Cl.⁵ ........................ H03H 7/06; H03H 3/013
[52] U.S. Cl. ................................... 333/172; 333/174; 333/181
[58] Field of Search ....................... 333/167, 172–174, 333/181, 185, 12; 73/35 K, 117.3; 123/425; 307/520; 328/167

[56] References Cited

U.S. PATENT DOCUMENTS

| 3,813,559 | 5/1974 | De Boer | 333/14 X |
| 4,163,385 | 8/1979 | Kato et al. | 73/35 K |
| 4,487,059 | 12/1984 | Fischer et al. | 73/116 |

FOREIGN PATENT DOCUMENTS

| 3137177 | 3/1983 | Fed. Rep. of Germany . |
| 3226073 | 4/1983 | Fed. Rep. of Germany . |
| 150865 | 11/1981 | Japan . |
| 207210 | 8/1988 | Japan . |
| 231214 | 9/1988 | Japan . |
| 2107470 | 4/1983 | United Kingdom . |

*Primary Examiner*—Seungsook Ham
*Attorney, Agent, or Firm*—Sughrue, Mion, Zinn, MacPeak and Seas

[57] ABSTRACT

A filter circuit for an electromagnetic pickup can always generate a noise-filtered output signal of a high resolution without any substantial degradation of an S/N ratio even if the frequency of low-freqeucny noise components contained in an output of an electromagnetic pickup, increases in accordance with the increasing rotational speed of the rotating shaft. The filter circuit includes a low-pass filter 2 for filtering high-frequency noise components contained in the output signal from the electromagnetic pickup, and a high-pass filter 3 for filtering low-frequency noise components having frequencies lower than a predetermined cut-off frequency. The high-pass filter 3 comprises a capacitor 131 inserted in a signal line connected to the low-pass filter 2, a plurality of resistors 132, 133, 134 connected to the signal line 140 in parallel relation with respect to each other, and a plurality of switches SW1, SW2 connected to the corresponding resistors for switching on and off electrical connection of the corresponding resistors to the signal line in dependence upon the output voltage of the electromagnetic pickup. The switches are sequentially switched on in accordance with an increase in the output voltage of the electromagnetic pickup whereby the cut-off frequency of the high-pass filter is increased in accordance with the increasing output voltage of the electromagnetic pickup.

6 Claims, 2 Drawing Sheets

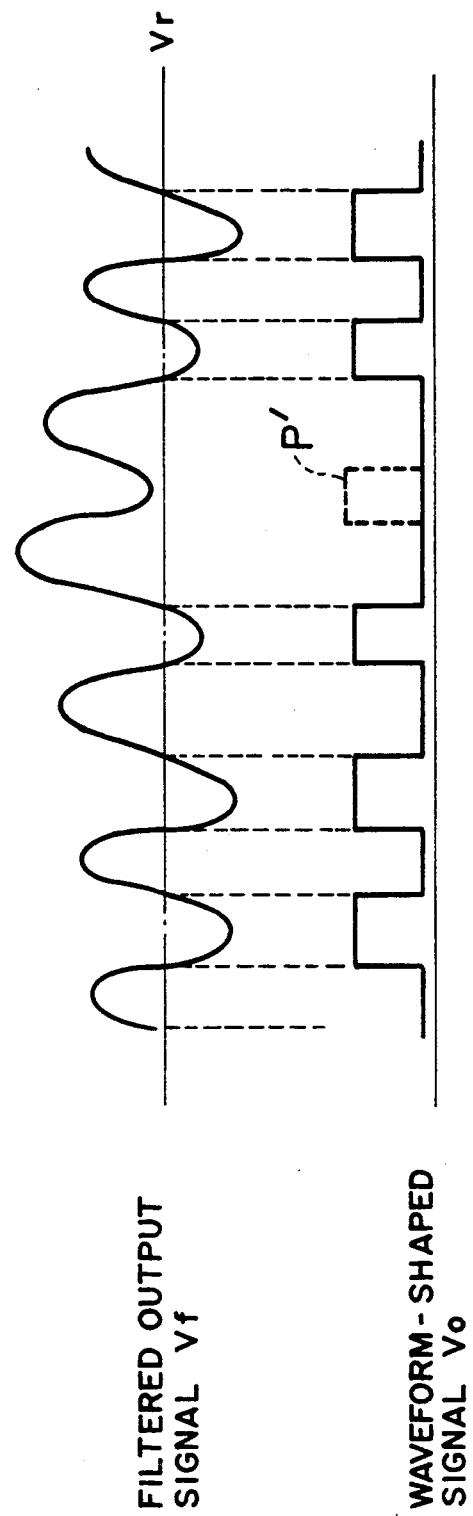

FILTER CIRCUIT FOR AN ELECTROMAGNETIC PICKUP

BACKGROUND OF THE INVENTION

The present invention relates generally to an electromagnetic pickup which is disposed in the vicinity of a rotating shaft, such as a crankshaft of an internal combustion engine, for sensing the rotation or rotational angle of the rotating shaft, and more particularly, it relates to a filter circuit for such an electromagnetic pickup which is particularly effective to filter or remove low-frequency noise components in an output signal of the electromagnetic pickup which vary in frequency in synchronization with a variation in the frequency of the output signal.

In general, in order to sense the rotational angle or crank angle of the crankshaft of an internal combustion engine, an electromagnetic pickup is disposed in an opposed relation to a ring gear which is mounted on the crankshaft for integral rotation therewith, so that it electromagnetically generates an electrical output signal in the form of a sinusoidal pulse each time it faces any one of teeth formed on the peripheral surface of the ring gear.

The sinusoidal output signal of the electromagnetic pickup thus formed is shaped into a desired rectangular waveform by means of a waveform shaper. In this connection, there is a fear that noise of high and low frequencies can be superposed on the output signal of the electromagnetic pickup due to vibrations of the ring gear and the like. Thus, it is necessary to remove noise components from the output signal of the electromagnetic pickup by means of a low-pass filter and a high-pass filter at the time of waveform shaping.

FIG. 2 is a circuit diagram illustrating a known filter circuit with a waveform shaper for an electromagnetic pickup. In this figure, the illustrated filter circuit includes an input terminal 1 on which an output signal Vi from an unillustrated electromagnetic pickup is imposed, a low-pass filter 2 for filtering or removing high-frequency components in the output signal Vi of the electromagnetic pickup, and a high-pass filter 3 connected in series with the low-pass filter 2 for removing or filtering low-frequency components in the output signal Vi. The low-pass filter 2 includes a resistor 21 connected at one end thereof to the input terminal 1, and a capacitor 22 connected between the other end of the resistor 21 and ground. The high-pass filter circuit 3 includes a capacitor 31 connected at one end thereof to a junction between the resistor 21 and the capacitor 22, and a resistor 32 connected between the other end of the capacitor 31 and ground.

The waveform shaper comprises a comparator 4 having a negative input terminal connected to a junction between the capacitor 31 and the resistor 32 so as to receive a filtered output signal Vf of the high-pass filter 3, a positive input terminal on which a reference voltage Vr is imposed from a reference voltage source 5, and an output terminal 6 for outputting a waveform shaped signal Vo as a final output signal of the electromagnetic pickup.

Now, the operation of the above-mentioned known filter circuit will be described in detail with particular reference to a waveform diagram of FIG. 3. First, as the engine crankshaft rotates together with the ring gear fixedly mounted thereon, the unillustrated electromagnetic pickup generates an output signal Vi having a sinusoidal waveform in synchronization with the crankshaft rotation. The output signal Vi from the electromagnetic pickup generally contains low-frequency and high-frequency noise components superposed thereon. The low-frequency noise components are mainly generated by the crankshaft rotation and have low frequencies corresponding to the rotational speed or number of revolutions per minute of the crankshaft, whereas the high-frequency noise components are generated by other electrical or electronic equipment disposed near the electromagnetic pickup. Thus, in order to remove these noise components, the output signal Vi from the electromagnetic pickup is fed to the input terminal 1 of the filter circuit comprising the low-pass filter 2 and the high-pass filter 3. The low-pass filter 2 serves to attenuate signal components having frequencies higher than a first predetermined higher cut-off frequency $f_1$, which is set by a circuit constant given by the resistor 21 and the capacitor 22, to thereby remove high-frequency components contained in the output signal Vi. The thus filtered signal Vi is then fed to the high-pass filter 3 where signal components having frequencies lower than a second predetermined lower cut-off frequency fo, which is set by a circuit constant given by the capacitor 31 and the resistor 32, are thereby attenuated and removed. In this respect, the second lower cut-off frequency fo is given by the following equation:

$$fo = 1/(2\pi CR) \tag{1}$$

where C is the capacitance of the capacitor 31 and R is the resistance of the resistor 32.

In this manner, the output signal Vi of the electromagnetic pickup is subject to filtering so that the high-frequency and low-frequency noise components contained therein are removed to provide a filtered output signal Vf which only contains signal components having desired intermediate frequencies between the upper and lower cut-off frequencies $f_1$, fo.

The thus filtered signal Vf is input to the negative input terminal of the comparator 4 where it is compared with the reference level Vr at the positive input terminal thereof to generate a waveform-shaped signal Vo in the form of a pulse which is formed by components of the signal Vf lower than the reference level Vr. The waveform-shaped signal Vo is then output from the output terminal 6 of the comparator 4, so that it is finally used for sensing the rotational angle or position of the crankshaft.

With the above-mentioned known filter circuit, however, the frequency and voltage of the output signal Vi generated by the electromagnetic pickup increases in accordance with an increase in the rotational speed or the number of revolutions per minute of the engine, so at the same time, the frequency and voltage of low-frequency noise components superposed on the signal Vi also increase in accordance with the increasing engine rotational speed.

Although the low-frequency noise corresponding to the number of revolutions per minute of the engine is generally filtered and removed by the high-pass filter 3, if the frequency of the low-frequency components increases above the lower cut-off frequency fo, which is set to a constant value irrespective of the engine rotational speed, the low-frequency noise components superposed on the signal Vi are not filtered but are input to the comparator 4.

As a result, the level of the filtered output signal Vf varies in accordance with the varying rotational speed of the engine, as clearly seen from FIG. 3, and in an extreme case, the lowest level of the filtered signal Vf from the high-pass filter 3 can exceed the reference level Vr. In this case, there will be a pulse loss P' in the waveform-shaped output signal Vo from the comparator 4, so no desired or required pulse shape will be obtained, thus resulting in an error in the sensed crankshaft angle or position, for example.

To summarize, in the known filter circuit as described above, the lower cut-off frequency fo is constant irrespective of the engine rotational speed, so if the frequency of the low-frequency noise components due to the engine rotation increases above the lower cut-off frequency fo in accordance with the increasing frequency of the output signal Vi from the electromagnetic pickup, it becomes impossible to filter or remove the low-frequency noise components, making it difficult to obtain a desired or required S/N ratio, particularly in a relatively low part of the intermediate-frequency range of the output signal Vi.

SUMMARY OF THE INVENTION

Accordingly, the present invention is intended to overcome the above-mentioned problems encountered with the known filter circuit, and has for its object the provision of a novel and improved filter circuit for an electromagnetic pickup which is able to improve the S/N ratio, particularly when the frequency of low-frequency noise components increase in accordance with the increasing frequency of an output signal from the electromagnetic pickup, thereby providing a noise-filtered output signal of a high resolution at all times over the entire operating frequencies of the electromagnetic pickup.

In order to achieve the above object, according to the present invention, there is provided a filter circuit for filtering noise components superposed on an output signal from an electromagnetic pickup, the filter circuit comprising: a low-pass filter connected to receive the output signal of the electromagnetic pickup for filtering therefrom high-frequency noise components having frequencies higher than a first predetermined value; and a high-pass filter connected in series with the low-pass filter for filtering low frequency noise components which are contained in the output signal of the electromagnetic pickup and which have frequencies lower than a second predetermined value which is less than the first predetermined value, the high-pass filter including means for controlling the second predetermined value such that the second predetermined value increases in accordance with an increase in the output voltage of the electromagnetic pickup.

In a broader form, the means for controlling the second predetermined value comprises: a plurality of circuit elements connected in parallel with respect to each other; and switch means connected in series with at least one of the circuit elements for selectively switching on and off the electrical connection of the at least one circuit element to the other circuit elements depending on the output voltage of the electromagnetic pickup so that when the output voltage of the electromagnetic pickup exceeds a predetermined voltage, it is turned on to electrically connect the at least one circuit element to the other circuit elements so as to increase the second predetermined value.

In a more specific form, the high-pass filter comprises: a signal line having one end thereof connected to the first low-pass filter and the other end thereof to an output terminal; a capacitor inserted in the signal line; a plurality of resistors connected between the signal line and ground in parallel relation with respect to each other; and switch means connected in series with at least one of the resistors for selectively switching on and off the electrical connection of the at least one resistor to the signal line depending on the output voltage of the electromagnetic pickup so that when the output voltage of the electromagnetic pickup exceeds a predetermined voltage, it is turned on to electrically connect the at least one resistor to the signal line so as to increase the second predetermined value.

Preferably, the switch means comprises a plurality of switches each connected in series with a corresponding one of the resistors, the switches being sequentially turned on in accordance with an increase in the output voltage of the electromagnetic pickup so that the second predetermined value is accordingly changed in a stepwise manner depending on the increasing output voltage.

The above and other objects, features and advantages of the invention will become more readily apparent from the following detailed description of a preferred embodiment of the invention taken in conjunction with the accompanying drawings.

BRIEF DESCRIPTION OF THE DRAWINGS

FIG. 3 is a waveform diagram showing waveforms of a filtered output signal Vf and a waveform-shaped signal Vo of the known filter circuit.

DESCRIPTION OF THE PREFEFRED EMBODIMENT

A preferred embodiment of the invention will now be described in detail while referring to the accompanying drawings.

Figure 1:
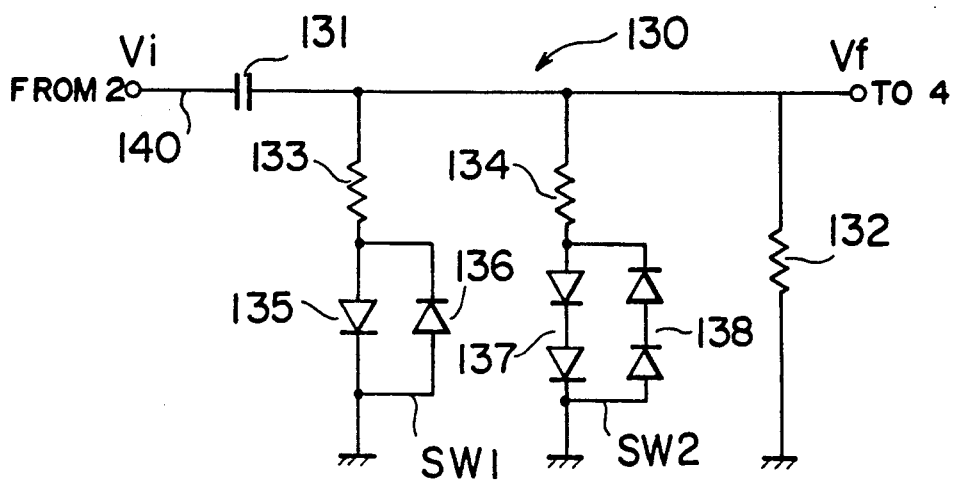
FIG. 1 is a schematic circuit diagram of a high-pass filter of a filter circuit for an electromagnetic pickup in accordance with the present invention.
Figure 2:
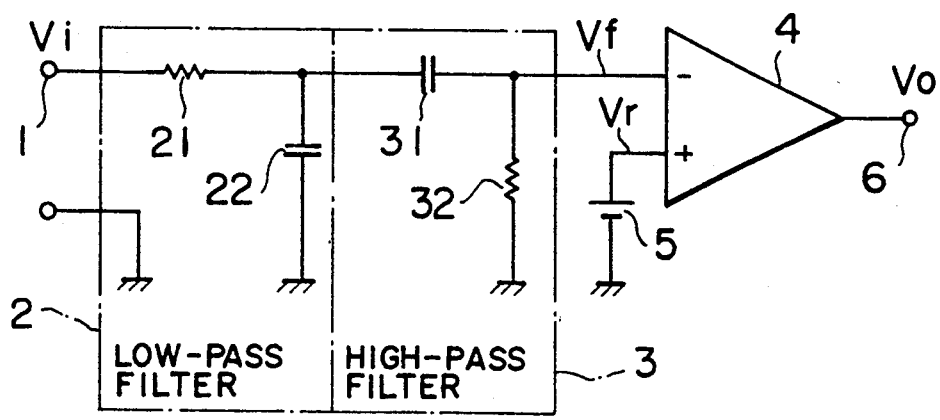
FIG. 2 is a schematic circuit diagram of a known filter circuit for an electromagnetic pickup.

FIG. 1 shows a high-pass filter 130 of a filter circuit for an electromagnetic pickup constructed in accordance with the present invention. Although not shown, the filter circuit of the invention includes, in addition to the high-pass filter 130, a low-pass filter with an input terminal and waveform shaper in the form of a comparator with a reference voltage source and an output terminal, all of which are the same as the elements 2, 3, 4, 5 and 6 of the above-mentioned known filter circuit of FIG. 2, and hence referred to by the same symbols in the following description.

In FIG. 1, the high-pass filter 130 includes a signal line 140 which is connected at one end thereof to an output terminal of the low-pass filter 2 (see FIG. 2), i.e., to the junction between the resistor 21 and the capacitor 22 of the low-pass filter 2, and at the other end thereof to the comparator 4 (see FIG. 2), i.e., the negative input terminal thereof. A capacitor 131 is inserted in and serially connected to the signal line 140. A plurality of (three in the illustrated embodiment) circuit elements in the form of resistors 132, 133 and 134 are respectively connected between the signal line 140 and ground in parallel relation with respect to each other at locations between the capacitor 131 and the comparator 4. Connected to the resistor 133 is a first switch SW1 which comprises a pair of diodes 135, 136 connected between the resistor 133 and ground in parallel relation with respect to each other with their polarities oriented in opposite directions. Also, connected to the resistor 134 is a second switch SW2 comprising a pair of first serial diodes 137, 137 and second serial diodes 138, 138, which are connected between the resistor 134 and ground in parallel relation with respect to each other with the polarities of the first serial diodes 137, 137 being in opposite relation with respect to those of the second serial diodes 138, 138. In this connection, the switching voltage of the diodes 137, 138 of the second switch SW2, at which they are switched on, is set to a level 2 Vf, two times greater than the switching voltage Vf of the diodes 135, 136 of the first switch SW1.

The operation of this embodiment will be described below while referring to FIG. 1. When the rotational speed of the number of revolutions per minute of the engine is relatively low, the frequency and voltage of an output signal Vi generated by the unillustrated electromagnetic pickup are also low. In this case, if the voltage of the filtered output signal Vi from the low-pass filter 2 is lower than the switching voltage Vf of the first switch SW1, the first and second switches SW1 and SW2 are both switched off. Accordingly, in this case (i.e., Vi<Vf), the lower cut-off frequency fo for the high-pass filter 3 is calculated using equation (1) referred to above, as in the previously described known filter circuit. That is, the lower cut-off frequency fo is equal to $1/(2\pi R)$. In this condition, the frequency of low-frequency noise superposed on the output signal Vi of the electromagnetic pickup is sufficiently low, and hence the low-frequency noise can be substantially filtered or removed by the high-pass filter 3 without fail.

On the other hand, when the rotational speed of the engine increases to raise the voltage of the output signal Vi of the electromagnetic pickup above the switching voltage Vf of the first switch SW1, the first switch SW1 is turned on so that the resistor 133 is electrically connected between the signal line 140 and ground in parallel relation with the resistor 132. Accordingly, in this case (i.e., Vf≤Vi<2 Vf), the lower cut-off frequency fo1 is expressed as follows:

$$fo1 = 1/[2\pi C\{R \times R1/(R+R1)\}] > fo \qquad (2)$$

where R1 is the resistance of the resistor 133.

In this manner, by switching the first switch SW1 on to electrically connect the resistor 133 to the capacitor 131 in addition to the resistor 132 always connected thereto, the total or combined resistance of the resistor 132 and the additional resistor 133 becomes less than the resistance R of the resistor 132, thus making the cut-off frequency fo1 at this time higher than the value of fo. As a result, when the frequency of the low-frequency noise rises in accordance with the increasing frequency Vi of the output signal Vi from the electromagnetic pickup, the second lower cut-off frequency is accordingly changed from the lower value fo to the higher value fo1, whereby low-frequency noise components contained in the output signal Vi can be substantially removed with a high degree of reliability.

Moreover, when the voltage of the output signal Vi of the electromagnetic pickup further rises above the switching voltage 2 Vf of the second switch SW2, the second switch SW2 in addition to the first switch SW1 is subsequently turned on to place the resistor 134 as well as the resistor 133 in electrical connection to the capacitor 131. As a result, the cut-off frequency fo2 at this time (i.e., 2 Vf≤Vi) is expressed as follows:

$$fo2 = 1/[2\pi C\{R \times R1 + R1 \times R2 + R \times R2)/(R + R1 + R2)\}] > fo1 \qquad (3)$$

where R2 is the resistance of the resistor 134.

In this manner, by switching the second switch SW2 on to electrically connect the resistor 134 in addition to the resistor 133 to the capacitor 131, the actual total or combined resistance of the resistors 132, 133 and 134 can be further reduced, thus making the cut-off frequency higher than the value fo1. Accordingly, even if the frequency of the output signal Vi of the electromagnetic pickup increases with the increasing voltage thereof, it is ensured that low-frequency noise components contained therein can be substantially removed, maintaining the S/N ratio of the filtered output signal Vf at a high value of resolution.

The switching operations of the first and second switches SW1, SW2 are automatically carried out in dependence upon a variation in the voltage of the output signal Vi of the electromagnetic pickup. Thus, with the provisions of the plurality of parallel resistors 133, 134 and the plurality of switches SW1, SW2 comprising the diodes 135 through 138 serially connected thereto, it is possible to change the second lower cut-off frequency in a simple manner with the very simple construction.

The resistances R1, R2 of the parallel resistors 133, 134 are set to such values as to offset a variation in the noise frequencies resulting from a variation in the voltage of the output signal Vi of the electromagnetic pickup. In addition, the number of parallel resistors and their associated switches to be connected to the capacitor 131 can be arbitrarily changed as required.

Although in the above embodiment, the switches SW1, SW2 are constituted by a plurality of diodes 135 through 138 which are connected in parallel with each other with their polarities directed in opposite relation, they can be constructed by transistor switches generally used in the related art. In this case, it is necessary to provide control circuits for driving transistors on and off in response to the voltage or frequency of the output signal Vi of the electromagnetic pickup.

What is claimed is:

1. A filter circuit for filtering noise components superposed on an output signal from an electromagnetic pickup, said filter circuit comprising:

a low-pass filter (2) connected to receive the output signal of said electromagnetic pickup for filtering therefrom high-frequency noise components having frequencies higher than a first predetermined value; and a high-pass filter (130) connected in series with said low-pass filter for filtering low frequency noise components contained in the output signal of said electromagnetic pickup, said low frequency noise components having frequencies lower than a second predetermined value which is less than said first predetermined value, and said high-pass filter including means for automatically controlling the second predetermined value as a function of voltage such that the second predetermined value increases in accordance with an increase in an output voltage of said electromagnetic pickup.

2. A filter circuit according to claim 1, wherein said means for automatically controlling the second predetermined value comprises:
- a plurality of circuit elements (133, 134) connected in parallel with respect to each other; and
- switch means (SW1, SW2) connected in series with at least one of said circuit elements for selectively switching on and off electrical connection of said at least one circuit element to the other circuit elements depending on the output voltage of said electromagnetic pickup so that when the output voltage of said electromagnetic pickup exceeds a predetermined voltage, said switch means is turned on to electrically connect said at least one circuit element to the other circuit elements so as to increase the second predetermined value.

3. A filter circuit according to claim 1, where said high-pass filter comprises:
- a signal line (140) having one end thereof connected to said low-pass filter and the other end thereof to an output terminal;
- a capacitor connected in series in said signal line;
- a plurality of resistors connected between said signal line and ground in parallel relation with respect to each other; and
- switch means connected in series with at least one of said resistors for selectively switching on and off electrical connection of said at least one resistor to said signal line depending on the output voltage of said electromagnetic pickup so that when the output voltage of said electromagnetic pickup exceeds a predetermined voltage, said switch means is turned on to electrically connect said at least one resistor to said signal line so as to increase the second predetermined value.

4. A filter circuit according to claim 3, where said switch means comprises a plurality of switches individually connected in series with said resistors, said switches being sequentially turned on in accordance with an increase in the output voltage of said electromagnetic pickup so that the second predetermined value is accordingly changed in a stepwise manner depending on the increasing output voltage.

5. A filter circuit according to claim 3, wherein said switch means comprises a plurality of diodes connected in parallel to each other with polarities thereof oriented in opposite directions.

6. A filter circuit according to claim 4, wherein each of said switches comprises a plurality of diodes connected in parallel to each other with their polarities being oriented in opposite directions.

* * * * *